United States Patent
Choi et al.

(10) Patent No.: US 9,490,449 B2
(45) Date of Patent: Nov. 8, 2016

(54) ORGANIC LIGHT-EMITTING DISPLAY APPARATUS AND METHOD FOR MANUFACTURING THE SAME

(71) Applicant: SAMSUNG DISPLAY CO., LTD., Yongin, Gyeonggi-Do (KR)

(72) Inventors: Su-Hyuk Choi, Yongin (KR); Hyun Kim, Yongin (KR); Jae-Sun Lee, Yongin (KR); Jai-Hyuk Choi, Yongin (KR); Ung-Soo Lee, Yongin (KR); Jin-Woo Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/257,379

(22) Filed: Apr. 21, 2014

(65) Prior Publication Data

US 2015/0028301 A1 Jan. 29, 2015

(30) Foreign Application Priority Data

Jul. 25, 2013 (KR) .................. 10-2013-0088269

(51) Int. Cl.
*H01L 51/52* (2006.01)

(52) U.S. Cl.
CPC .................. *H01L 51/5253* (2013.01)

(58) Field of Classification Search
CPC ........... H01L 51/5253; H01L 27/3244; H01L 51/56; H01L 51/5237; H01L 51/5262; H01L 51/5268; H01L 51/5271; B82Y 20/00; B82Y 30/00; H05B 33/22; H05B 33/10; H05B 33/14
USPC ...... 257/40, 88, 98, E33.074; 438/28, 29, 2; 313/504; 445/25
See application file for complete search history.

(56) References Cited

U.S. PATENT DOCUMENTS

| | | | |
|---|---|---|---|
| 2003/0117071 A1* | 6/2003 | Lee | H01L 51/5221 313/512 |
| 2006/0170336 A1* | 8/2006 | Ono | H01L 27/322 313/504 |
| 2007/0040501 A1 | 2/2007 | Aitken et al. | |
| 2007/0082575 A1* | 4/2007 | Shin | C03C 3/091 445/24 |
| 2007/0252526 A1 | 11/2007 | Aitken et al. | |
| 2008/0149924 A1 | 6/2008 | Aitken et al. | |
| 2010/0193353 A1 | 8/2010 | Aitken et al. | |
| 2013/0230665 A1* | 9/2013 | Park | H01L 51/5253 427/535 |

FOREIGN PATENT DOCUMENTS

| | | |
|---|---|---|
| KR | 1020080045217 | 5/2008 |
| KR | 1020080080019 | 9/2008 |
| KR | 1020100050470 | 5/2010 |

* cited by examiner

*Primary Examiner* — David Vu
*Assistant Examiner* — Mouloucoulaye Inoussa
(74) *Attorney, Agent, or Firm* — F. Chau & Associates, LLC (57) ABSTRACT

An organic light-emitting display apparatus includes: a substrate, and an organic light-emitting device disposed on the substrate. The organic light-emitting device includes a first electrode, a second electrode, and an intermediate layer including at least an organic emission layer. In addition, the organic light-emitting display apparatus further includes a thin film encapsulating layer disposed on the organic light-emitting device. The thin film encapsulating layer includes at least one inorganic film including a low temperature viscosity transition (LVT) inorganic material. The LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$).

21 Claims, 3 Drawing Sheets

ORGANIC LIGHT-EMITTING DISPLAY APPARATUS AND METHOD FOR MANUFACTURING THE SAME

CROSS-REFERENCE TO RELATED APPLICATIONS

This application claims priority to Korean Patent Application No. 10-2013-0088269, filed on Jul. 25, 2013, the disclosure of which is hereby incorporated by reference herein in its entirety.

TECHNICAL FIELD

The present disclosure relates to an organic light-emitting display apparatus and a method for manufacturing the same, and more particularly, to a display apparatus capable of increasing encapsulation characteristic and durability, and a method for manufacturing the same.

DISCUSSION OF THE RELATED ART

Recently, display apparatuses have been used in various ways. As the display apparatuses become slimmer and lighter, the use of the display apparatuses is increasing. An organic light-emitting display apparatus is a self-luminous display apparatus having low power consumption, wide viewing angles, and high image quality.

The organic light-emitting display apparatus includes an organic light-emitting device that includes a first electrode, a second electrode, and at least an organic emission layer disposed therebetween.

On the other hand, the organic light-emitting device may be vulnerable to external moisture and heat. Therefore, there may be a need for an encapsulating structure that encapsulates the organic light-emitting device.

One of methods for forming the encapsulating structure is a sputtering method which uses a sputtering target. However, it may be difficult to form the encapsulating structure by using a sputtering method. Consequently, it may be difficult to increase the durability and encapsulation characteristics of the organic light-emitting display apparatus when using a sputtering method.

SUMMARY

Exemplary embodiments of the present invention include a display apparatus capable of having increased encapsulation characteristics and durability, and a method for manufacturing the same.

According to an exemplary embodiment of the present invention, an organic light-emitting display apparatus includes: a substrate, and an organic light-emitting device disposed on the substrate. The organic light-emitting device includes a first electrode, a second electrode, and an intermediate layer including at least an organic emission layer. In addition, the organic light-emitting display apparatus further includes a thin film encapsulating layer disposed on the organic light-emitting device. The thin film encapsulating layer includes at least one inorganic film including a low temperature viscosity transition (LVT) inorganic material. The LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$).

The LVT inorganic material may further include at least one of tin fluoride, niobium oxide, and tungsten oxide.

The LVT inorganic material may include tin oxide (SnO) and X, and in which X may be at least one of $B_2O_3$, $Bi_2O_3$, BaO, and $NH_4H_2PO_4$.

The LVT inorganic material may include tin oxide (SnO), tin fluoride ($SnF_2$), and X, and in which X is at least one of $B_2O_3$, $Bi_2O_3$, BaO, and $NH_4H_2PO_4$.

The LVT inorganic material may include tin oxide (SnO), tin fluoride ($SnF_2$), X, and niobium oxide (NbO), and in which X is at least one of $B_2O_3$, $Bi_2O_3$, BaO, and $NH_4H_2PO_4$.

The LVT inorganic material includes tin oxide (SnO), tin fluoride ($SnF_2$), X, and tungsten oxide ($WO_3$), and in which X is at least one of $B_2O_3$, $Bi_2O_3$, BaO, and $NH_4H_2PO_4$.

A viscosity transition temperature of the LVT inorganic material may be a minimum temperature capable of providing a flowability to the LVT inorganic material.

A viscosity transition temperature of the LVT inorganic material may be lower than a metamorphic temperature of a material included in the intermediate layer of the organic light-emitting device.

The organic light-emitting display apparatus may further include a planarization layer or a protection layer disposed between the organic light-emitting device and the thin film encapsulating layer.

The thin film encapsulating layer may cover a top surface and a side of the organic light-emitting device.

According to an exemplary embodiment of the present invention, a method for manufacturing an organic light-emitting display apparatus includes: forming an organic light-emitting device on a substrate, in which the organic light-emitting device includes a first electrode, a second electrode, and an intermediate layer including at least an organic emission layer, and forming a thin film encapsulating layer on the organic light-emitting device. The thin film encapsulating layer includes at least one inorganic film including a low temperature viscosity transition (LVT) inorganic material. The LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$).

The forming of the thin film encapsulating layer may be performed using a sputtering process.

The sputtering process may be performed using a sputtering target that includes tin oxide and at least one of $B_2O_3$, $Bi_2O_3$, BaO, and $NH_4H_2PO_4$.

The sputtering process may be performed while the substrate is moving in at least one direction.

The sputtering process may use two faced sputtering targets that do not face the substrate.

The method may further include: generating a plasma in a space between the two faced sputtering targets, and disposing the substrate to face the space where the plasma is generated.

One or more magnet units may be disposed to face a surface opposite to a surface facing the plasma in surfaces of the two faced sputtering targets.

The forming of the thin film encapsulating layer may include: forming a preliminary thin film encapsulating layer including the LVT inorganic material, and healing the preliminary thin film encapsulating layer.

The healing of the preliminary thin film encapsulating layer may be performed in a temperature range from a viscosity transition temperature of the LVT inorganic material to a metamorphic temperature of a material included in the intermediate layer of the organic light-emitting device.

The healing of the preliminary thin film encapsulating layer may be performed in a temperature range from a viscosity transition temperature of the LVT inorganic material to a minimum value of metamorphic temperatures of a material included in the intermediate layer of the organic light-emitting device.

The healing of the preliminary thin film encapsulating layer may be performed at a viscosity transition temperature of the LVT inorganic material.

The healing of the preliminary thin film encapsulating layer may be performed by annealing the preliminary thin film encapsulating layer in a temperature range of about 80° C. to about 132° C. for about one hour to about three hours.

The healing of the preliminary thin film encapsulating layer may be performed in a vacuum atmosphere or an inert gas atmosphere.

In accordance with an exemplary embodiment, an organic light-emitting display apparatus is provided. The organic light-emitting display apparatus includes a substrate, and an organic light-emitting device disposed on a top surface of the substrate. The organic light-emitting device includes a first electrode, a second electrode, and an intermediate layer including at least an organic emission layer.

In addition, the organic light-emitting display apparatus further includes a thin film encapsulating layer covering a top surface and opposing sidewalls of the organic light-emitting device and having lower edges which protrude outwardly along the top surface of the substrate. The thin film encapsulating layer includes at least one inorganic film including a low temperature viscosity transition (LVT) inorganic material. The LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$).

BRIEF DESCRIPTION OF THE DRAWINGS

Exemplary embodiments of the present invention can be understood in more detail from the following detailed description, taken in conjunction with the accompanying drawings in which.

DETAILED DESCRIPTION OF EXEMPLARY EMBODIMENTS

Reference will now be made in detail to embodiments, examples of which are illustrated in the accompanying drawings, wherein like reference numerals refer to the like elements throughout. In this regard, exemplary embodiments of the present embodiments may have different forms and should not be construed as being limited to the descriptions set forth herein. Accordingly, exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, as sizes and thicknesses of components in the drawings are arbitrarily illustrated for convenience of explanation, exemplary embodiments are not limited thereto.

As used herein, the singular forms, "a", "an", and "the" are intended to include plural forms as well, unless the context clearly indicates otherwise.

Exemplary embodiments of the present invention will be described below in more detail with reference to the accompanying drawings. Throughout the disclosure, like reference numerals refer to like parts, and a redundant description thereof will be omitted.

Figure 1:
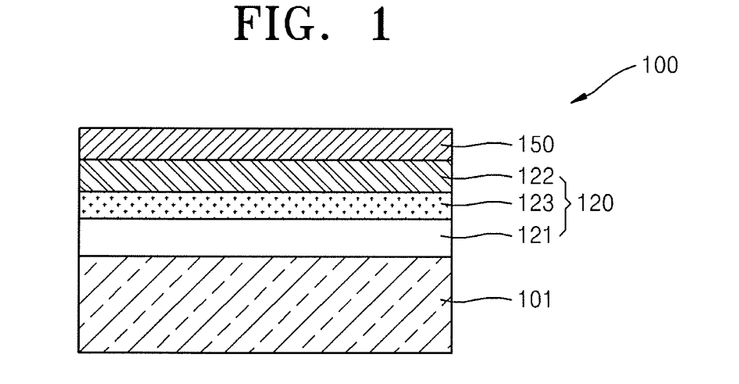
FIG. 1 is a schematic cross-sectional view of an organic light-emitting display apparatus according to an embodiment of the present invention.

FIG. 1 is a schematic cross-sectional view of an organic light-emitting display apparatus according to an embodiment of the present invention.

Referring to FIG. 1, the organic light-emitting display apparatus 100 includes, for example, a substrate 101, an organic light-emitting device 120, and a thin film encapsulating layer 150 including at least one inorganic film including a low temperature viscosity transition (LVT) inorganic material.

The substrate 101 may be formed using various materials. For example, the substrate 101 may be formed of a transparent glass material including silicon oxide ($SiO_2$) as a main component. In addition, the substrate 101 may be formed of, for example, a transparent plastic material or a transparent quartz material. Further, in an embodiment, the substrate 101 may be, for example, a flexible substrate. Suitable materials for the flexible substrate include, for example, polyethylenenaphthalate, polyethylene terephthalate, polyacryl, polyimide, polyethersulfone, polyvinyl chloride, or combinations thereof.

The organic light-emitting device 120 is disposed on the substrate 101 and includes, for example, a first electrode 121, a second electrode 122, and an intermediate layer 123. For example, the first electrode 121 is disposed on the substrate 101, the second electrode 122 is disposed on the first electrode 121, and the intermediate layer 123 is disposed between the first electrode 121 and the second electrode 122.

In an embodiment, a buffer layer formed of, for example, silicon oxide ($SiO_2$), silicon nitride ($SiN_x$) and/or silicon oxynitride (SiON) may be further disposed between the first electrode 121 and the substrate 101. The buffer layer may provide a flat surface on the substrate 101 and may prevent moisture and gas from penetrating through the substrate 101.

For example, the first electrode 121 may function as an anode, and the second electrode 122 may function as a cathode. The order of the polarities of the first electrode 121 and the second electrode 122 may be reversed.

When the first electrode 121 functions as the anode, the first electrode 121 may include, for example, indium tin oxide (ITO), indium zinc oxide (IZO), zinc oxide (ZnO), or indium oxide ($In_2O_3$) having a high work function. The first electrode 121 may further include, for example, a reflection film including silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), calcium (Ca), aluminum-lithium (Al—Li), magnesium-Indium (Mg—In), or magnesium-silver (Mg—Ag) depending on the purpose and design condition thereof.

When the second electrode 122 functions as the cathode, the second electrode 122 may be formed of a metal such as, for example, Ag, Mg, Al, Pt, Pd, Au, Ni, Nd, Ir, Cr, Li, Ca, Al—Li, Mg—In, or Mg—Ag. In addition, the second electrode 122 may include, for example, a light transmission material, such as ITO, IZO, ZnO, or $In_2O_3$.

The intermediate layer 123 includes, for example, at least an organic emission layer. In addition to the organic emission layer, the intermediate layer 123 may include, for example, at least one selected from the group consisting of a hole injection layer, a hole transport layer, an electron transport layer, and an electron injection layer.

When a voltage is applied to the first electrode 121 and the second electrode 122, visible light is generated from the intermediate layer 123, and more particularly, the organic emission layer of the intermediate layer 123.

In an embodiment, the organic light-emitting display apparatus 100 may include at least one thin film transistor electrically connected to the organic light-emitting device 120. The organic light-emitting display apparatus 100 may include, for example, at least one capacitor electrically connected to the organic light-emitting device 120.

In an embodiment, at least one planarization layer or at least one protection layer may be provided between the organic light-emitting device 120 and the thin film encapsulating layer 150. The planarization layer or the protection layer provide a flat surface on the organic light-emitting device 120 and primarily protect the organic light-emitting device 120. The planarization layer or the protection layer may be formed using various insulating materials. For example, the planarization layer or the protection layer may be formed using an organic material. For example, in an embodiment, the planarization layer may be formed of a material selected from the group consisting of benzocyclobutene (BCB), polyimide (PI), polyamide (PA), an acrylic resin and a phenolic resin. Also, in an embodiment, the protection layer may be formed of, for example, an inorganic insulating layer having a silicon oxide ($SiO_2$) layer, a silicon nitride (SiNx) layer or a stacked structure thereof.

The thin film encapsulating layer 150 is provided on the organic light-emitting device 120. The thin film encapsulating layer 150 includes, for example, at least one inorganic film including an LVT inorganic material.

The term "viscosity transition temperature" used herein does not refer to a temperature at which the LVT inorganic material completely changes from solid to liquid, but refers to a minimum temperature at which fluidity may be provided to the LVT inorganic material, that is, a minimum temperature at which a viscosity of the LVT inorganic material changes.

The viscosity transition temperature of the LVT inorganic material may be, for example, lower than the metamorphic temperature of the material included in the intermediate layer 123. For example, the viscosity transition temperature of the LVT inorganic material may be lower than the minimum value of the metamorphic temperatures of the material included in the intermediate layer 123.

The metamorphic temperature of the intermediate layer 123 refers to a temperature that may cause a physical metamorphosis and/or a chemical metamorphosis of the material included in the intermediate layer 123. A plurality of metamorphic temperatures may be present depending on types and number of the material included in the intermediate layer 123. For example, the viscosity transition temperature of the LVT inorganic material and the metamorphic temperature of the intermediate layer 123 may refer to a glass transition temperature (Tg) of the LVT inorganic material and a glass transition temperature (Tg) of an organic material included in the intermediate layer 123.

The glass transition temperature may be measured by, for example, performing a Thermo Gravimetric Analysis (TGA) on the organic material included in the LVT inorganic material and the intermediate layer 123.

For example, the glass transition temperature may be derived from a result of a thermal analysis using a TGA and a Differential Scanning calorimetry (DSC) with respect to the material included in the intermediate layer 123 ($N_2$ atmosphere, temperature range: room temperature to about 600° C. (10° C./min)-TGA, room temperature to about 400° C.-DSC, pan type: Pt pan in disposable Al Pan (TGA), disposable Al pan (DSC)), which may easily be recognized by those skilled in the art.

The metamorphic temperature of the material included in the intermediate layer 123 may exceed, for example, about 130° C., but exemplary embodiments of the present invention are not limited thereto. As described above, the metamorphic temperature of the material included in the intermediate layer 123 may readily be measured through the TGA.

The minimum value among the metamorphic temperatures of the material included in the intermediate layer 123 may be, for example, about 130° C. to about 140° C. For example, the minimum value among the metamorphic temperatures of the material included in the intermediate layer 123 may be, for example, about 132° C., but exemplary embodiments of the present invention are not limited thereto. As described above, the minimum value among the metamorphic temperatures of the material included in the intermediate layer 123 may be determined by obtaining the values of Tg through the TGA and selecting the minimum value among the various values of Tg.

For example, the viscosity transition temperature of the LVT inorganic material may be about 80° C. or higher. In an embodiment, the viscosity transition temperature of the LVT inorganic material may be, for example, in the range of about 80° C. to about 132° C., but exemplary embodiments of the present invention are not limited thereto. For example, in an embodiment, the viscosity transition temperature of the LVT inorganic material may be about 80° C. to about 120° C., or about 100° C. to about 120° C., but exemplary embodiments of the present invention are not limited thereto. For example, in an embodiment, the viscosity transition temperature of the LVT inorganic material may be about 110° C.

The LVT inorganic material may be a single compound or a mixture of two or more kinds of compounds.

The LVT inorganic material includes, for example, tin oxide (for example, SnO or $SnO_2$). In addition, the LVT inorganic material further includes, for example, any one of boron oxide ($B_2O_3$), bismuth oxide ($Bi_2O_3$), barium oxide (BaO), and ammonium dihydrogen phosphate ($NH_4H_2PO_4$). The content of SnO may be, for example, about 20 wt % to about 100 wt %.

For example, the LVT inorganic material may further include one or more of tin fluoride (for example, $SnF_2$), niobium oxide (for example, NbO), and tungsten oxide (for example, $WO_3$), but exemplary embodiments of the present invention are not limited thereto.

For example, the LVT inorganic material may be

SnO and X;

SnO, $SnF_2$, and X;

SnO, $SnF_2$, X, and NbO; or

SnO, $SnF_2$, X, and $WO_3$.

The X may be, for example, any one of $B_2O_3$, $Bi_2O_3$, BaO, and $NH_4H_2PO_4$.

Alternatively, in an embodiment, the X may be, for example, multiple. For example, the X may include $B_2O_3$ and BaO. In this case, the LVT inorganic material may be SnO, $B_2O_3$, and BaO;

SnO, $SnF_2$, $B_2O_3$, and BaO;

SnO, $SnF_2$, $B_2O_3$, BaO, and NbO; or

SnO, $SnF_2$, $B_2O_3$, BaO, and $WO_3$.

However, the present embodiment of the present invention is not limited thereto, and the X may include, for example, at least two of $B_2O_3$, $Bi_2O_3$, BaO, and $NH_4H_2PO_4$.

As all of $B_2O_3$, $Bi_2O_3$, BaO, and $NH_4H_2PO_4$ have an excellent reactivity with SnO, the LVT inorganic material may readily be formed. As $B_2O_3$, $Bi_2O_3$, BaO, and $NH_4H_2PO_4$ each have a low reactivity with moisture, it is possible to prevent the thin film encapsulating layer 150 including the LVT inorganic material from being expanded by moisture or being peeled off from adjacent layers. Therefore, dark spots of the organic light-emitting display apparatus 100 are suppressed, and the durability thereof is increased.

As $B_2O_3$ has excellent chemical durability and a low melting point, the manufacturing process and encapsulation characteristic of the thin film encapsulating layer 150 by using the LVT inorganic material are increased. As BaO has excellent chemical durability and a high transmittance, a transmittance of the thin film encapsulating layer 150 is increased. $NH_4H_2PO_4$ effectively suppresses a reactivity with moisture while reacting with SnO.

For example, the LVT inorganic material may have the following composition, but the present embodiment of the present invention is not limited thereto. As described above, X may be, for example, any one of $B_2O_3$, $Bi_2O_3$, BaO, and $NH_4H_2PO_4$. Alternatively, in an embodiment, X may include, for example, at least two of $B_2O_3$, $Bi_2O_3$, BaO, and $NH_4H_2PO_4$.

1) SnO (80 wt %) and X (20 wt %); (for example, X means 20 wt % of $B_2O_3$ or 20 wt % of ($B_2O_3$+BaO)

2) SnO (20-50 wt %), $SnF_2$ (30-60 wt %), and X (10-30 wt %) (where the total weight of SnO, $SnF_2$, and X is 100 wt %);

3) SnO (20-50 wt %), $SnF_2$ (30-60 wt %), X (10-30 wt %), and NbO (1-5 wt %) (where the total weight of SnO, $SnF_2$, X, and NbO is 100 wt %); or 4) SnO (20-50 wt %), $SnF_2$ (30-60 wt %), X (10-30 wt %), and $WO_3$ (1-5 wt %) (where the total weight of SnO, $SnF_2$, X, and $WO_3$ is 100 wt %).

For example, the LVT inorganic material may include SnO (42.5 wt %), $SnF_2$ (40 wt %), X (15 wt %), and $WO_3$ (2.5 wt %), but exemplary embodiments of the present invention are not limited thereto.

When the thin film encapsulating layer 150 including the inorganic film of the above-described composition is formed, the viscosity transition temperature may be maintained to be lower than the metamorphic temperature of the intermediate layer 123. Therefore, various types of defects, which may be formed in the thin film encapsulating layer 150, may be healed in a healing process to be described below.

In an embodiment, the thin film encapsulating layer 150 may include, for example, a film-formation component. The film-formation component may be, for example, inorganic particles formed during the film formation process of the thin film encapsulating layer 150. As described below, the film-formation component may be healed in the subsequent healing process and form a portion of the thin film encapsulating layer 150.

The organic light-emitting display apparatus 100 according to the present embodiment includes, for example, the thin film encapsulating layer 150 on the organic light-emitting device 120, and the thin film encapsulating layer 150 includes, for example, the LVT inorganic material. Therefore, it is possible to prevent thermal damage to the intermediate layer 123 of the organic light-emitting device 120 and to increase moisture permeability characteristics thereof. In addition, the use of the thin film encapsulating layer 150 suppresses damage to the organic light-emitting display apparatus 100 even though various film-formation components may be generated.

According to the present embodiment, as the LVT inorganic material provided in the thin film encapsulating layer 150 includes, for example, SnO and one or more of $B_2O_3$, $Bi_2O_3$, BaO, and $NH_4H_2PO_4$, a reactivity with SnO is increased and a reactivity with moisture is suppressed. Hence, a manufacturing characteristic of the thin film encapsulating layer 150 is increased, and an encapsulation characteristic of the thin film encapsulating layer 150 is increased. Consequently, the failure of the organic light-emitting display apparatus 100 is suppressed, and the durability of the organic light-emitting display apparatus 100 is increased.

Figure 2:
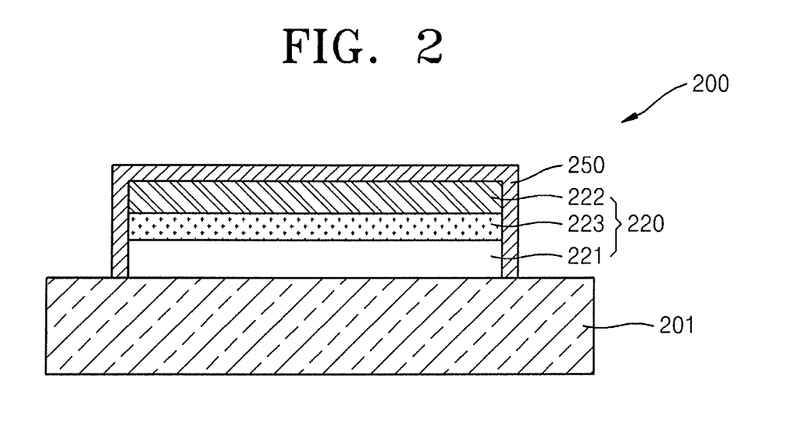
FIG. 2 is a schematic cross-sectional view of an organic light-emitting display apparatus according to an embodiment of the present invention.

FIG. 2 is a schematic cross-sectional view of an organic light-emitting display apparatus according to an embodiment of the present invention. Referring to FIG. 2, the organic light-emitting display apparatus 200 includes, for example, a substrate 201, an organic light-emitting device 220, and a thin film encapsulating layer 250 including at least one inorganic film including an LVT inorganic material.

The organic light-emitting device 220 includes, for example, a first electrode 221, a second electrode 222, and an intermediate layer 223.

For convenience, the following description will focus on differences between the above-described organic light-emitting display apparatus of FIG. 1 and the organic light-emitting display apparatus of the present exemplary embodiment of FIG. 2.

The present embodiment of FIG. 2 differs from the above-described organic light-emitting display apparatus of FIG. 1 in the structure of the thin film encapsulating layer 250. In the present embodiment, the thin film encapsulating layer 250 is configured to cover a top surface and a side of the organic light-emitting device 220. This may prevent the organic light-emitting device 220 from being damaged from moisture, external gas, and foreign substances. In addition, the thin film encapsulating layer 250 contacts the substrate 201. Therefore, the thin film encapsulating layer 250 effectively encapsulates the organic light-emitting device 220. As the thin film encapsulating layer 250 contacts the substrate 201, the thin film encapsulating layer 250 may not be peeled off from the organic light-emitting display apparatus 200, and the durability of the thin film encapsulating layer 250 is increased. In an embodiment, the thin film encapsulating layer 250 may contact an insulating film or a conductive film additionally formed on the top surface of the substrate 201.

As materials used to form the organic light-emitting device 220 and the thin film encapsulating layer 250 are substantially identical to those materials used to form the above-described organic light-emitting display apparatus of FIG. 1, a detailed description thereof will be omitted.

Figure 3:
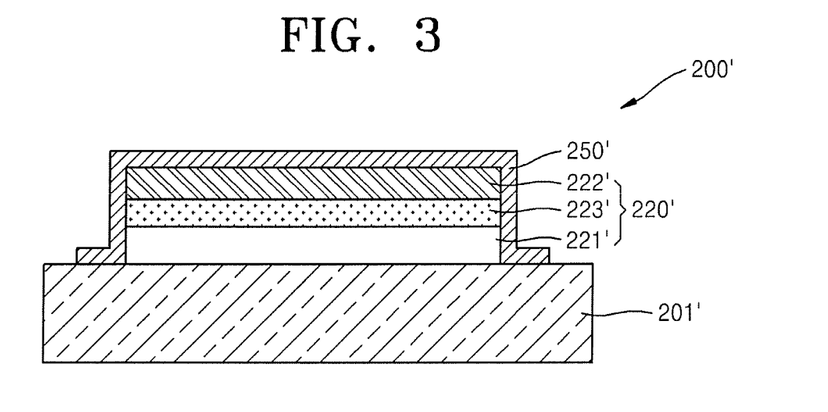
FIG. 3 is a schematic cross-sectional view of an organic light-emitting display apparatus according to an embodiment of the present invention.

FIG. 3 is a cross-sectional view of an organic light-emitting display apparatus according to an embodiment of the present invention.

Referring to FIG. 3, the organic light-emitting display apparatus 200' includes, for example, a substrate 201', an organic light-emitting device 220', and a thin film encapsulating layer 250'. The thin film encapsulating layer 250' includes, for example, at least one inorganic film including an LVT inorganic material. The organic light-emitting device 220' includes, for example, a first electrode 221', a second electrode 222', and an intermediate layer 223'.

For convenience, the following description will focus on differences between the above-described organic light-emitting display apparatuses of FIGS. 1 and 2 and the organic light-emitting display apparatus of the present embodiment of FIG. 3.

In the present embodiment, an edge of the thin film encapsulating layer 250' protrudes outward. For example, a region contacting the substrate 201' in the thin film encapsulating layer 250' protrudes, leading to an increase in a contact area between the thin film encapsulating layer 250' and the substrate 201'. Due to the increase in the contact area between the thin film encapsulating layer 250' and the substrate 201', it is possible to effectively prevent moisture, gas and foreign substances from penetrating through a gap between the thin film encapsulating layer 250' and the substrate 201'. In addition, as the thin film encapsulating layer 250' is stably connected to the substrate 201', the durability of the thin film encapsulating layer 250' and the organic light-emitting display apparatus 200' is increased.

As materials used to form the organic light-emitting device 220' and the thin film encapsulating layer 250' are substantially identical to those materials used to form the above-described organic light-emitting display apparatuses of FIGS. 1 and 2, a detailed description thereof will be omitted.

FIGS. 4A to 4D are views of a method for manufacturing an organic light-emitting display apparatus according to an embodiment of the present invention.

In this embodiment, a method for manufacturing the organic light-emitting display apparatus 200 of FIG. 2 will be described below. However, this is merely for convenience of description, and it is clear that the present embodiment may also be applied to, for example, the organic light-emitting display apparatuses 100 and 200' of FIGS. 1 and 3, respectively.

Figure 4A:
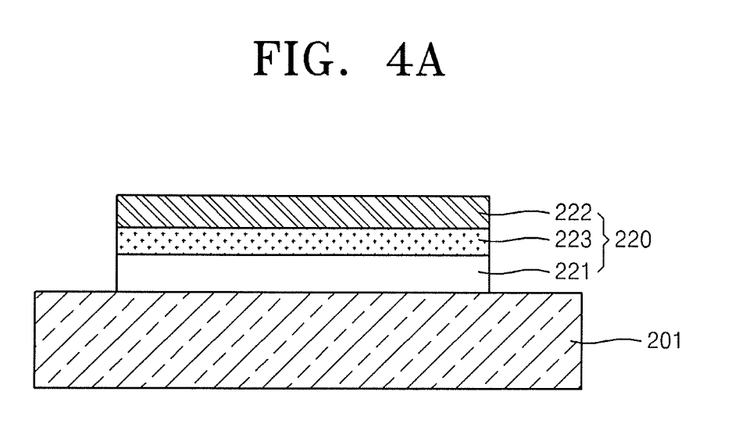
FIGS. 4A to 4D are views of a method for manufacturing an organic light-emitting display apparatus according to an embodiment of the present invention.

Referring to FIG. 4A, an organic light emitting device 220 is formed on a substrate 201. The organic light-emitting device 220 includes, for example, a first electrode 221, a second electrode 222, and an intermediate layer 223. The intermediate layer 223 includes, for example, at least an inorganic emission layer.

In an embodiment, a planarization layer or a protection layer may be, for example, further formed on the organic light-emitting device 220.

Figure 4B:
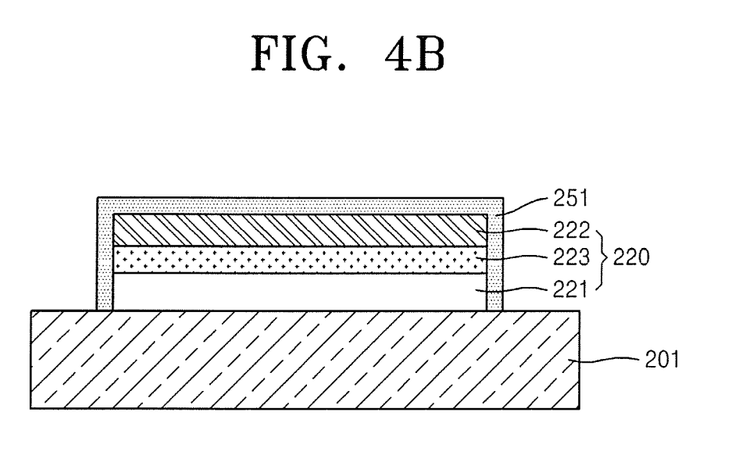

Referring to FIG. 4B, a preliminary thin film encapsulating layer 251 for forming a thin film encapsulating layer 250 is formed. As described above, the preliminary thin film encapsulating layer 251 is formed using, for example, an LVT inorganic material. The forming of the preliminary thin film encapsulating layer 251 may be performed using, for example, a sputtering process, a vacuum evaporation process, a low-temperature deposition process, an electron beam coating process, or an ion plating process.

For example, the LVT inorganic material having a composition $SnO-SnF_2-X-WO_3$ may be provided on the organic light-emitting device 220 through the sputtering process. In this case, as described above, X includes, for example, at least one of $B_2O_3$, $Bi_2O_3$, BaO, and $NH_4H_2PO_4$.

Figure 4C:
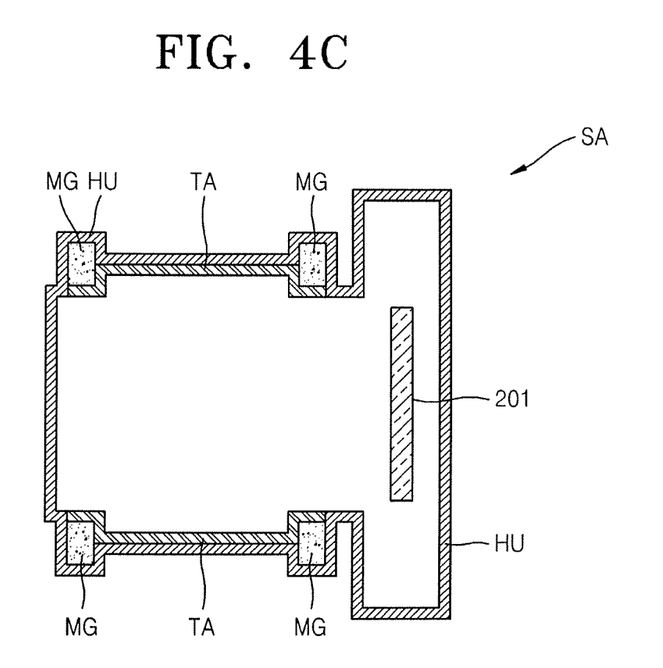

FIG. 4C exemplarily illustrates a method of forming the preliminary thin film encapsulating layer 251 including the LVT inorganic material on the organic light-emitting device 220 and the substrate 201 by using a sputtering apparatus SA.

Referring to FIG. 4C, the sputtering apparatus SA includes, for example, two faced sputtering targets TA within a housing HU.

The sputtering target TA includes, for example, SnO and X. As described above, X includes, for example, at least one of $B_2O_3$, $Bi_2O_3$, BaO, and $NH_4H_2PO_4$. For example, the sputtering target TA includes SnO, $SnF_2$, X, and $WO_3$, and X includes at least one of $B_2O_3$, $Bi_2O_3$, BaO, and $NH_4H_2PO_4$.

Magnet units MG are disposed on surfaces opposite to the surfaces facing the sputtering targets TA. The substrate 201 does not directly face the sputtering targets TA. For example, the substrate 201 is disposed to face a space between the two faced sputtering targets. Plasma is generated in the space between the two faced sputtering targets TA. Atoms of inert gas, such as, for example, argon (Ar), which has no direct relation to the sputtering, rarely directly travels towards the substrate 201. Therefore, it is possible to prevent damage to the surface of the substrate 201 or the organic light-emitting device 220 formed on the surface of the substrate 201.

In the present embodiment, the organic light-emitting device 220 has been formed on the substrate 201. However, alternatively, in an embodiment, a planarization layer or a protection layer may be formed on the substrate 201 prior to forming the organic light-emitting device 220. To effectively perform the process of forming the preliminary thin film encapsulating layer 251, the process may be performed, for example, while the substrate 201 is moving in one or more directions. In this manner, the preliminary thin film encapsulating layer 251 having a desired thickness (for example, about 1 μm) may readily be formed.

In an embodiment, the preliminary thin film encapsulating layer 251 may include various defects such as, for example, a film-formation component, a pinhole, and an environmental component. The environmental component is, for example, an organic material or an inorganic material. The environmental component may be, for example, particles attached during the forming of the organic light-emitting display apparatus 200. In addition, defects such as, for example, an empty space between the preliminary thin film encapsulating layer 251 and the organic light-emitting device 120 may be generated. The film-formation component refers to an aggregate particle of the LVT inorganic material that does not contribute to the film formation during the film formation of the preliminary thin film encapsulating layer 251. The pinhole is a region where the LVT inorganic material is not provided.

The above-described defects of the preliminary thin film encapsulating layer 251 may serve as a passage of external environmental materials such as, for example, moisture or oxygen. This may cause progressive dark spots to be formed, which may reduce the life of the organic light-emitting display apparatus 200.

Figure 4D:
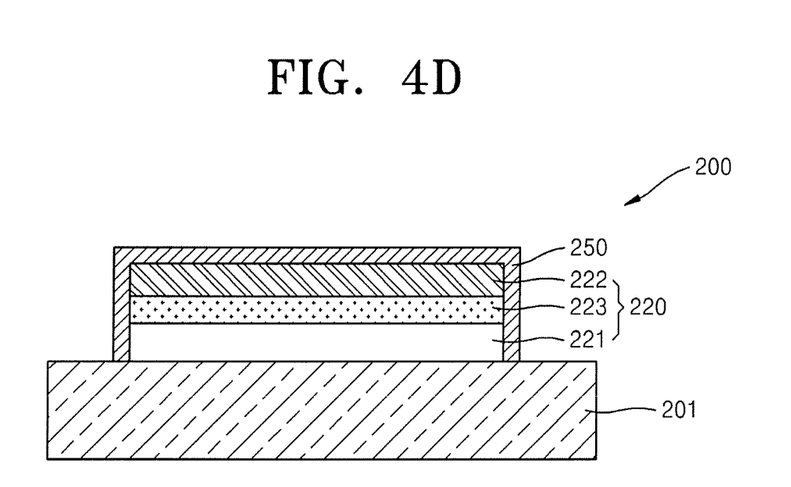

Therefore, after the preliminary thin film encapsulating layer 251 is formed, a healing process is performed to form the thin film encapsulating layer 250 as illustrated in FIG. 4D.

The healing process is performed, for example, at a higher temperature than a viscosity transition temperature of the LVT inorganic material. For example, the healing process may be performed by annealing the preliminary thin film encapsulating layer 251 in the range from the viscosity transition temperature of the LVT inorganic material to the metamorphic temperature of the material of the intermediate layer included in the organic light-emitting device 220. Alternatively, in an embodiment, the healing process may be performed by, for example, annealing the preliminary thin film encapsulating layer 251 in the range from the viscosity transition temperature of the LVT inorganic material to a minimum value of metamorphic temperatures of the material included in the intermediate layer of the organic light-emitting device 220. Alternatively, in an embodiment, the healing process may be performed, for example, at the viscosity transition temperature of the LVT inorganic material. For example, the healing process may be performed by annealing the preliminary thin film encapsulating layer 251 in the range of about 80° C. to about 132° C. (for example, in the range of about 80° C. to about 120° C. or in the range of about 100° C. to about 120° C.) for about one hour to about three hours (for example, at about 110° C. for about two hours), but exemplary embodiments of the present invention are not limited thereto. When the temperature of the heating process satisfies the above-described range, the fluidity of the LVT inorganic material of the preliminary thin film encapsulating layer 251 may be achieved and the metamorphosis of the intermediate layer of the organic light-emitting device 220 may be prevented. To prevent the preliminary thin film encapsulating layer 251 from being exposed to the external environment through the pinhole, the healing process may be performed, for example, in an IR oven under a vacuum atmosphere or an inert gas atmosphere (for example, $N_2$ atmosphere or Ar atmosphere).

Due to the healing process, the LVT inorganic material included in the preliminary thin film encapsulating layer 251 may be fluidized. The fluidized LVT inorganic material may have a flowability. Therefore, during the healing process, the fluidized LVT inorganic material may flow in and fill a gap formed by the environmental component, the fluidized LVT inorganic material may flow in and fill the pinhole, and the film-formation component may be fluidized and fill the pinhole.

By forming the thin film encapsulating layer 250, the organic light-emitting display apparatus 200 is completed.

In addition, alternatively in an embodiment, a healing process may be further performed. In other words, the heat resistance and mechanical strength of the thin film encapsulating layer 250 may be increased by performing the healing process two times.

As described above, according to embodiments of the present invention, the organic light-emitting display apparatus and the method for manufacturing the same may readily increase the durability and encapsulation characteristics thereof.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light-emitting display apparatus comprising:
   a substrate;
   an organic light-emitting device disposed on the substrate, wherein the organic light-emitting device comprises a first electrode, a second electrode, and an intermediate layer including at least an organic emission layer; and
   a thin film encapsulating layer disposed on the organic light-emitting device, wherein the thin film encapsulating layer comprises at least one inorganic film including a low temperature viscosity transition (LVT) inorganic material, wherein the LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$),
   wherein a viscosity transition temperature of the LVT inorganic material is lower than a metamorphic temperature of the intermediate layer.

2. The organic light-emitting display apparatus of claim 1, wherein the LVT inorganic material further includes at least one of tin fluoride, niobium oxide, and tungsten oxide.

3. The organic light-emitting display apparatus of claim 1, wherein the LVT inorganic material includes tin oxide (SnO) and X, wherein X is at least one of $B_2O_3$, $Bi_2O_3$, BaO, and $NH_4H_2PO_4$.

4. An organic light-emitting display apparatus comprising:
   a substrate;
   an organic light-emitting device disposed on the substrate, wherein the organic light-emitting device comprises a first electrode, a second electrode, and an intermediate layer including at least an organic emission layer; and
   a thin film encapsulating layer disposed on the organic light-emitting device, wherein the thin film encapsulating layer comprises at least one inorganic film including a low temperature viscosity transition (LVT) inorganic material, wherein the LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$),
   wherein the LVT inorganic material includes tin oxide (SnO), tin fluoride ($SnF_2$), and X, wherein X is at least one of $B_2O_3$, $Bi_2O_3$, BaO, and $NH_4H_2PO_4$.

5. The organic light-emitting display apparatus of claim 4, wherein the LVT inorganic material further includes niobium oxide (NbO).

6. The organic light-emitting display of claim 4, wherein the LVT inorganic material further includes tungsten oxide ($WO_3$).

7. The organic light-emitting display apparatus of claim 1, wherein a viscosity transition temperature of the LVT inorganic material is a minimum temperature capable of providing a flowability to the LVT inorganic material.

8. The organic light-emitting display apparatus of claim 1, wherein the thin film encapsulating layer covers a top surface and a side of the organic light-emitting device.

9. A method for manufacturing an organic light-emitting display apparatus, the method comprising:
   forming an organic light-emitting device on a substrate, wherein the organic light-emitting device includes a first electrode, a second electrode, and an intermediate layer including at least an organic emission layer; and forming a thin film encapsulating layer on the organic light-emitting device, wherein the thin film encapsulating layer comprises at least one inorganic film including a low temperature viscosity transition (LVT) inorganic material, wherein the LVT inorganic material includes tin oxide and at least one of boron oxide ($B_2O_3$), bismuth oxide ($Bi_2O_3$), barium oxide (BaO), and ammonium dihydrogen phosphate ($NH_4H_2PO_4$), wherein when the thin film encapsulation layer is formed, the viscosity transmission temperature is maintained to be lower than the metamorphic temperature of the intermediate layer.

10. The method of claim 9, wherein the forming of the thin film encapsulating layer is performed using a sputtering process.

11. The method of claim 10, wherein the sputtering process is performed using a sputtering target that includes tin oxide and at least one $B_2O_3$, $Bi_2O_3$, BaO, and $NH_4H_2PO_4$.

12. The method of claim 10, wherein the sputtering process is performed while the substrate is moving in at least one direction.

13. The method of claim 10, wherein the sputtering process uses two faced sputtering targets that do not face the substrate.

14. The method of claim 13, further comprising:
generating a plasma in a space between the two faced sputtering targets; and
disposing the substrate to face the space where the plasma is generated.

15. The method of claim 14, wherein one or more magnet units are disposed to face a surface opposite to a surface facing the plasma in surfaces of the two faced sputtering targets.

16. The method of claim 9, wherein the forming of the thin film encapsulating layer comprises:
forming a preliminary thin film encapsulating layer including the LVT inorganic material; and
healing the preliminary thin film encapsulating layer.

17. The method of claim 16, wherein the healing of the preliminary thin film encapsulating layer is performed in a temperature range from a viscosity transition temperature of the LVT inorganic material to a metamorphic temperature of a material included in the intermediate layer of the organic light-emitting device.

18. The method of claim 16, wherein the healing of the preliminary thin film encapsulating layer is performed in a temperature range from a viscosity transition temperature of the LVT inorganic material to a minimum value of metamorphic temperatures of a material included in the intermediate layer of the organic light-emitting device.

19. The method of claim 16, wherein the healing of the preliminary thin film encapsulating layer is performed at a viscosity transition temperature of the LVT inorganic material.

20. The method of claim 16, wherein the healing of the preliminary thin film encapsulating layer is performed by annealing the preliminary thin film encapsulating layer in a temperature range of about 80° C. to about 132° C. for about one hour to about three hours.

21. The method of claim 16, wherein the healing of the preliminary thin film encapsulating layer is performed in a vacuum atmosphere or an inert gas atmosphere.

* * * * *